United States Patent [19]

Lee

[11] Patent Number: 5,886,947
[45] Date of Patent: Mar. 23, 1999

[54] SEMICONDUCTOR MEMORY DEVICE WITH SHARED DATA INPUT/OUTPUT LINE

[75] Inventor: Ho-Cheol Lee, Suwon, Rep. of Korea

[73] Assignee: Samsung Electronics, Co., Ltd., Suwon, Rep. of Korea

[21] Appl. No.: 947,280

[22] Filed: Oct. 8, 1997

[30] Foreign Application Priority Data

Oct. 9, 1996 [KR] Rep. of Korea ................. 96-44895

[51] Int. Cl.$^6$ ............................... G11C 8/00
[52] U.S. Cl. ............... 365/233; 365/203; 365/189.08; 365/189.05
[58] Field of Search ............... 365/233, 203, 365/189.08, 189.05

[56] References Cited

U.S. PATENT DOCUMENTS 5,606,526  2/1997  Pilo .................... 365/189.05
5,751,644  5/1998  Ansel et al. .......... 365/194

Primary Examiner—David Nelms
Assistant Examiner—Andrew Q. Tran
Attorney, Agent, or Firm—Marger Johnson McCollom P.C.

[57] ABSTRACT

The semiconductor memory device includes a clock signal generating circuit, a precharge circuit, a write circuit, and an input/output circuit. The clock signal generating circuit generates a second clock signal having a second state of a constant interval irrespective of a period of a first clock signal. The precharge circuit precharges a data input/output line in response to a precharge signal. The write circuit transfers, during a write operation, input data signal to the data input/output line each time the second clock signal is a first state under the state that a power signal and the precharge signal are the first state. The input/output circuit transfers data transmitted to the data input/output line to a cell.

4 Claims, 4 Drawing Sheets

SEMICONDUCTOR MEMORY DEVICE WITH SHARED DATA INPUT/OUTPUT LINE

BACKGROUND OF THE INVENTION

1. Field of the Invention

The present invention relates to a semiconductor memory device and, more particularly, to a data input/output control circuit of the semiconductor memory device.

2. Description of the Prior Art

Semiconductor memory devices carry out write operations for transferring data received from the exterior of the device to a cell within the device, and execute read operations for transferring data within the cell to the exterior of the device. There is a tendency to share a write operation path and a read operation path in order to reduce the area of the device. There are various methods for controlling the path which shares the read and write operation.

With the demand for faster memory devices, at a frequency of 100 MHz or more, a data input/output line must operate within mere nanoseconds. Such an operation of the data input/output line has difficulty in repeating an operation for driving and precharging the data input/output within a few nanoseconds. Therefore, during the read operation, a current sense amplifier having a small swing (the voltage difference between a"high" level and a"low" level is a few millivolts) is used instead of utilizing a conventional method which fully swings the data input/output line between a power voltage and a ground voltage.

A conventional data input/output line is a shared line which always operates during the write and read operations, and when data is not written or read, for example, in case of not performing the write and read operations, in the middle of the successive write operation, and in the middle of the successive read operation. To exclude the possibility that there may occur an error due to the coupling or noise of effective data of the data input/output line, a latch is connected to the data input/output line.

Referring to FIG. 1, a conventional semiconductor memory device typically includes a cell 10, an input/output driver 12, a read driver 14, a signal PWT generating circuit 16, a write driver 18, a data output driver 20, and a latch 24. FIG. 2 illustrates the signal PWT generating circuit 16 shown in FIG. 1. The signal PWT generating circuit includes 6 serially connected inverters 40, 42, 44, 46, 48 and 50. FIG. 3 is an operational waveform chart of the semiconductor memory device of FIG. 1. The operation of the semiconductor memory device of FIG. 1 will now be described with reference to FIG. 3.

The signal PWT generating circuit 16 of FIG. 2 delays an input signal,"PCLK", and generates a signal PWT shown in FIG. 3. A precharge transistor 22 precharges a data input/output line,"DIO", in response to a precharge signal, "PRECH", shown in FIG. 3. The write driver 18 is enabled in response to a power signal PWR shown in FIG. 3, and passes input data,"DIN", to the data input/output line DIO in response to the signal PWT. The input/output driver 12 then transfers data received through the data input/output line DIO to the cell 10. The read driver 14 transfers data stored in the cell 10 to the latch 24 through the data input/output line DIO. The latch 24 holds data temporarily performing the write and read operations, in the middle of the successive write operation, and in the middle of the successive read operation. The data output driver 20 transmits data generated through the data input/output line DIO to the exterior.

The data write path of the conventional semiconductor memory device of FIG. 1 is: the signal PWT generating circuit 16 - the write driver 18 - the input/output driver 12 - the cell 10, and the data read path thereof is: the cell 10-the read driver 14-the data output driver 20. During writing, the input data DIN is transmitted to the data input/output line DIO through the write driver 18 at a"high" level of the signal PWT under the state that the power signal PWR and the precharge signal PRECH are at a"high" level.

When a current sense amplifier is used in case that there is the latch 24 as shown in the above semiconductor memory device, since the swing width of the data input/output line during the read operation is small, the latch can not be provided on the data input/output line. There are no problems even though the latch does not exist on the data input/output line during a read operation, since the current sense amplifier is used. However, a problem occurs during the write operation during the "floating interval" when the write driver is not transmitting the input data DIN onto the data input/output line. The floating interval varies with the input clock pulse width, according to the prior art. That is, in case that the successive write operation is implemented and a successive writing time interval varies, the writing time of the effective data is constant and the floating interval varies. However, as shown above, it would be desirable to keep the DIO line from floating too long yet avoid using a latch.

SUMMARY OF THE INVENTION

It is an object of the present invention to provide a semiconductor memory device for minimizing a floating time of a data input/output line and for preventing the data input/output line from malfunctioning without using a latch for preventing the data input/output line from being floated.

The semiconductor memory device embodying the present invention includes: a clock signal generating circuit for generating a second clock signal having a second state of a constant interval irrespective of a period of a first clock signal; a precharge circuit for precharging a data input/output line in response to a precharge signal; a write circuit for transferring, during a write operation, input data signal to the data input/output line each time the second clock signal is a first state under the state that a power signal and the precharge signal are the first state; and an input/output circuit for transferring data transmitted to the data input/output line to a cell. Thus, a second clock signal is generated internally for controlling the write driver so as to ensure a constant duration, relatively short floating period, even though the pulse width of the applied clock signal (PCLK) may vary along with its frequency.

BRIEF DESCRIPTION OF THE DRAWINGS

The above and other objects, features and advantages of the present invention will become more apparent from the following detailed description taken with the accompanying drawings in which.

DETAILED DESCRIPTION OF PREFERRED EMBODIMENT

Figure 4:
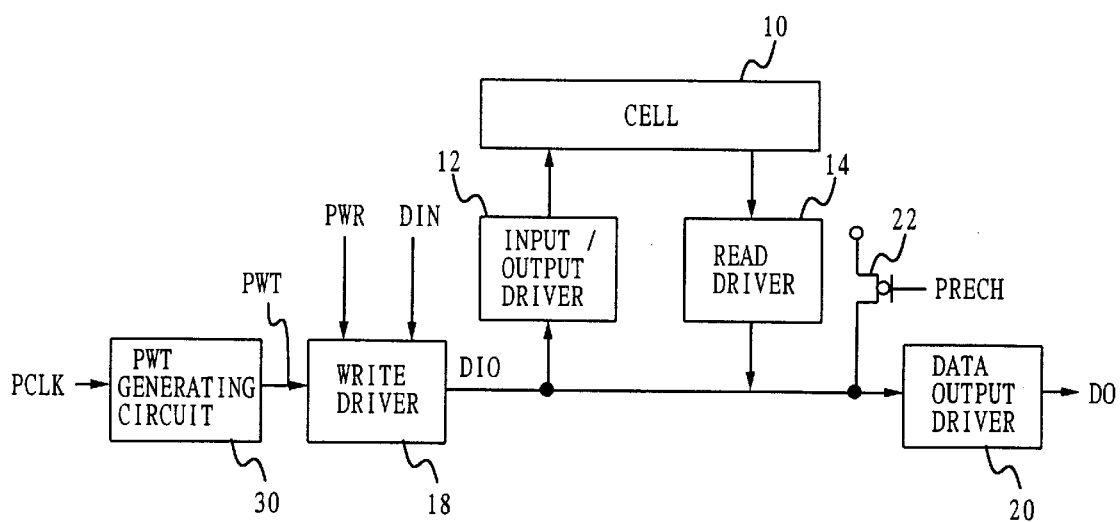
FIG. 4 is a block diagram of a semiconductor memory device according to the present invention.

Referring to FIG. 4, a semiconductor memory device according to the present invention includes a cell 10, an input/output driver 12, a read driver 14, a write driver 18, a data output driver 20, a precharge transistor 22, and a signal PWT generating circuit 30.

Figure 5:
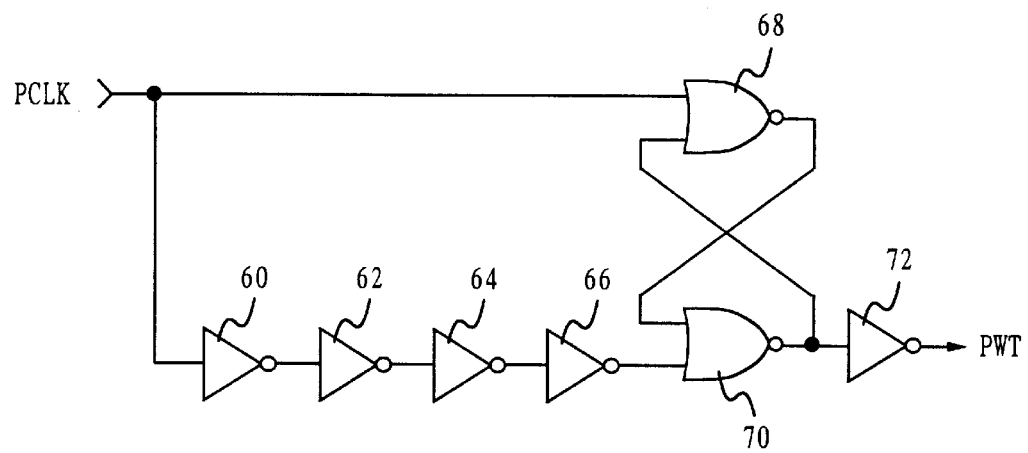
FIG. 5 is a circuit diagram of a signal PWT generating circuit shown in FIG. 4.

FIG. 5 is a circuit diagram of the signal PWT generating circuit 30 shown in FIG. 4. The signal PWT generating circuit 30 consists of inverters 60, 62, 64, 66, 72, and NOR gates 68 and 70. When an initial value of a signal PWT is a"low" level, if a signal PCLK becomes a"high" level, the signal PWT becomes a"high" level after propagation delay through the four-inverter chain. At the next"high" level of the signal PCLK, the signal PWT is changed to a"low" level from a"high" level. The signal PWT automatically returns to a"high" level four propagation delays later (due to the inverter chain). Thus the PWT"low" pulse width or duration is fixed, independently of the PCLK duty cycle or pulse width.

Figure 1:
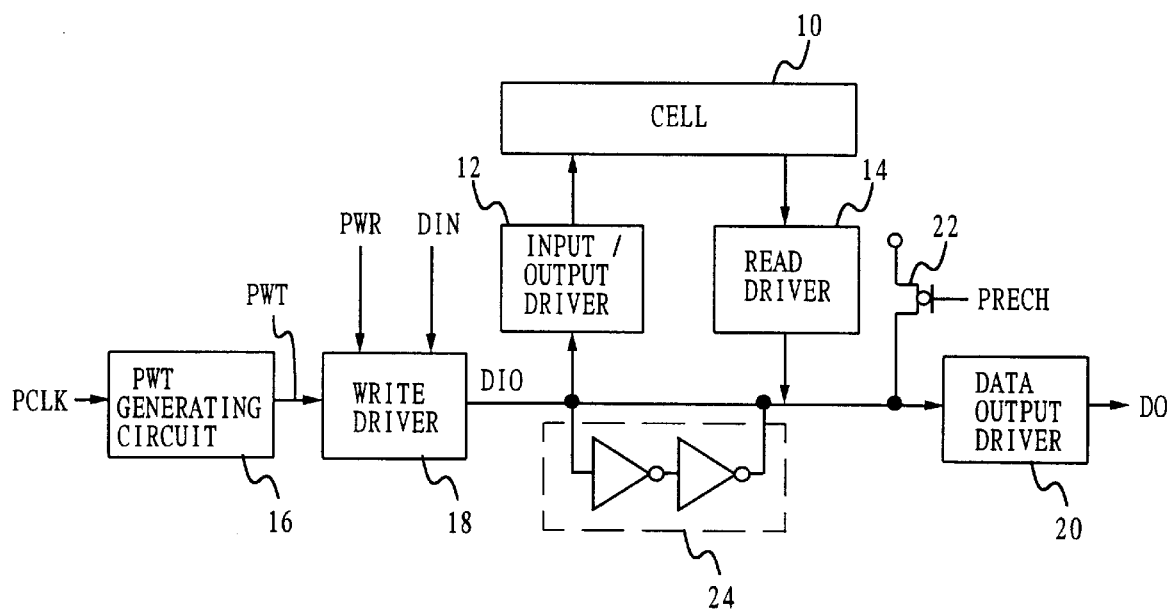
FIG. 1 is a block diagram of a conventional semiconductor memory device.
Figure 2:
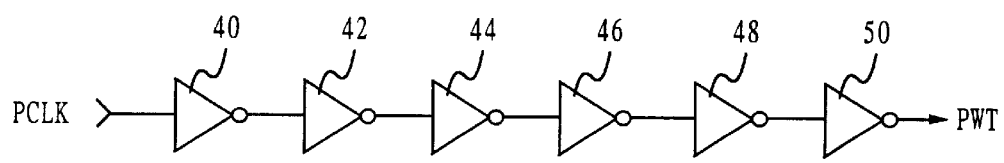
FIG. 2 is a circuit diagram of a signal PWT generating circuit shown in FIG. 1.
Figure 3:
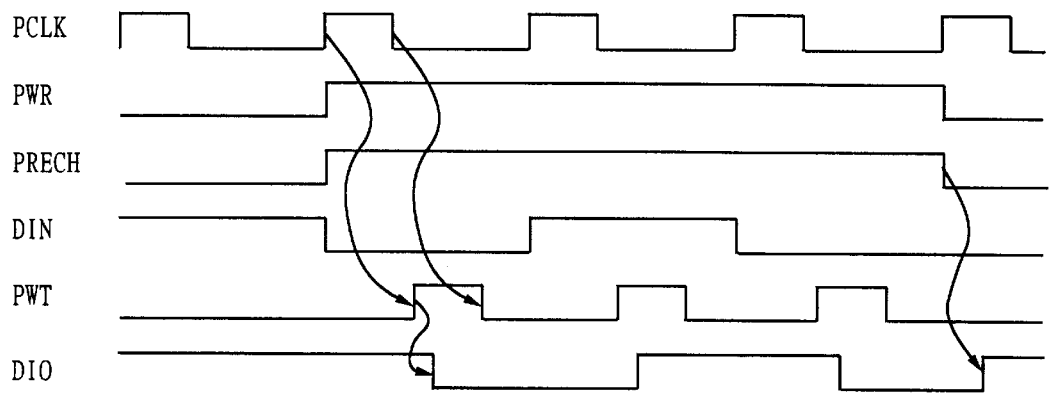
FIG. 3 is an operational waveform chart of the semiconductor memory device of FIG. 1.
Figure 7A:
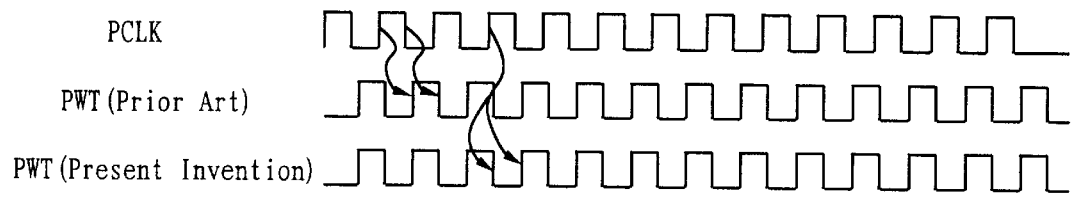
FIGS. 7a, 7b and 7c are waveform charts showing a signal PWT of the semiconductor memory devices of FIGS. 1 and 4 according to a period of a signal PCLK.
Figure 7B:
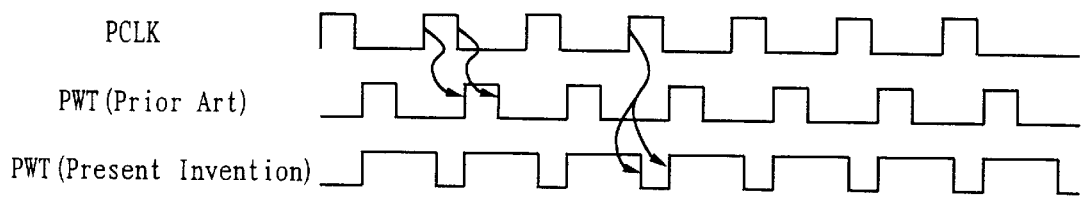
Figure 7C:
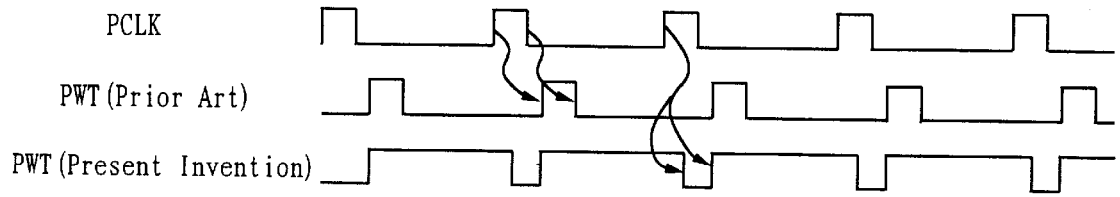

FIGS. 7a, 7b and 7c are waveform charts for making a comparison of the signal PWT of the signal PWT generating circuits indicated in FIGS. 1 and 4. The signal PWT of FIG. 1 is just a delayed signal of the signal PCLK. However, the signal PWT of FIG. 4 has a constant "low" level interval and a variable"high" level interval according to a period of the signal PCLK. In other words, if the period of the signal PCLK varies, a"high" level interval of the signal PWT of FIG. 1 is constant; whereas, on the other hand, the"low" level interval of the signal PWT of FIG. 4 is held constant.

Figure 6:
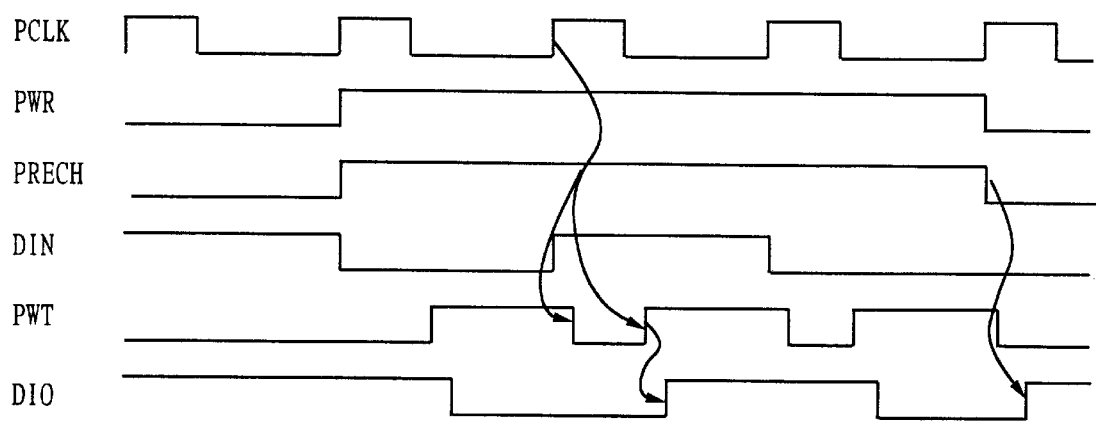
FIG. 6 is an operational waveform chart of the semiconductor memory device of FIG. 4.

FIG. 6 is an operational waveform chart of the semiconductor memory device of FIG. 4. In operation, the signal PWT generating circuit 30 shown in FIG. 4 receives the signal PCLK and generates the signal PWT indicated in FIG. 6. The precharge transistor 22 precharges a data input/output line DIO in response to a precharge signal PRECH shown in FIG. 6. The write driver 18 is enabled in response to a write signal PWR shown in FIG. 6, and supplies input data DIN to the data input/output line DIO in response to the signal PWT. The input/output driver 12 supplies data transmitted through the data input/output line DIO to the cell 10. The read driver 14 supplies data stored in the cell 10 to the data input/output line DIO. The data output driver 20 transmits data generated through the data input/output line DIO to the exterior.

A data write path of the semiconductor memory device of FIG. 4 is: the signal PWT generating circuit 30 - the write driver 18 - the input/output driver 12 - the cell 10, and a data read path thereof is: the cell 10 - the read driver 14 - the data output driver 20. During writing, the input data DIN is transmitted to the data input/output line DIO through the write driver 18 each time the signal PWT is a"high" level under the state that the write signal PWR and the precharge signal PRECH are a"high" level.

In the inventive semiconductor memory device, since the"low" level interval of the signal PWT is constant irrespective of the period of the signal PCLK, the floating interval of the data input/output line DIO is constant and small, and the latch of the data input/output line can be eliminated.

Therefore, the floating time of the data input/output line is minimized and the malfunction of the data input/output line can be prevented without using the latch for preventing the data input/output line from being floated.

While the present invention has been particularly shown and described with reference to the particular embodiments thereof, it will be understood by those skilled in the art that various changes in form and details may be effected therein without departing from the spirit and scope of the invention as defined by the appended claims.

What is claimed is:

1. A method of controlling a shared data input/output line in a semiconductor memory device, the method comprising:

receiving an applied clock signal (PCLK);

generating a second clock signal responsive to the applied clock signal, the second clock signal providing a constant-interval pulse having a first logic state triggered in response to each selected transition of the applied clock signal;

driving write data onto a shared data I/O line in the memory device during a second logic state of the second clock signal opposite the first logic state; and floating the shared data I/O line in the memory device only during the constant-interval pulse of the second clock signal, thereby minimizing a floating time of the data I/O line.

2. A method according to claim 1 wherein the applied clock signal is a periodic clock signal; and the selected transition of the applied clock signal is a rising edge.

3. A semiconductor memory device comprising:

clock signal generating means for generating a second clock signal having a second state of a constant interval irrespective of a period of a first clock signal;

precharge means for precharging a data input/output line in response to a precharge signal;

write means for transferring, during a write operation, input data signal to said data input/output line each time said second clock signal is in a first state and a power signal and said precharge signal are in the first state; and input/output means for transferring data transmitted to said data input/output line to a cell.

4. A semiconductor memory device as claimed in claim 3, wherein said clock signal generating means comprises:

serially connected inverters of even numbers for delaying said first clock signal;

a first NOR gate for NORing said first clock signal and an inverted signal of said second clock signal;

a second NOR gate for NORing an output signal of said first NOR gate and a final output signal of said inverters; and an inverter for receiving said inverted signal of said second clock signal and generating said second clock signal.

* * * * *